(12) United States Patent
Hammond et al.

(10) Patent No.: US 11,575,096 B2
(45) Date of Patent: Feb. 7, 2023

(54) VISUALLY UNDISTORTED THIN FILM ELECTRONIC DEVICES

(71) Applicants: Alliance for Sustainable Energy, LLC, Golden, CO (US); SolarWindow Technologies, Inc., Scottsdale, AZ (US)

(72) Inventors: Scott R. Hammond, Wheat Ridge, CO (US); Marinus Franciscus Antonius Maria van Hest, Golden, CO (US); John A. Conklin, Apalachin, NY (US)

(73) Assignees: SolarWindow Technologies, Inc., Scottsdale, AZ (US); Alliance for Sustainable Energy, LLC, Golden, CO (US)

(*) Notice: Subject to any disclaimer, the term of this patent is extended or adjusted under 35 U.S.C. 154(b) by 0 days.

(21) Appl. No.: 17/649,440

(22) Filed: Jan. 31, 2022

(65) Prior Publication Data

US 2022/0158105 A1 May 19, 2022

Related U.S. Application Data

(62) Division of application No. 16/414,492, filed on May 16, 2019, now Pat. No. 11,271,180.

(Continued)

(51) Int. Cl.
*H01L 51/44* (2006.01)
*H01L 27/30* (2006.01)
(Continued)

(52) U.S. Cl.
CPC ............ *H01L 51/44* (2013.01); *H01L 27/301* (2013.01); *H01L 31/0465* (2014.12); *H01L 51/0001* (2013.01)

(58) Field of Classification Search
CPC .... H01L 51/44; H01L 51/0001; H01L 27/301
See application file for complete search history.

(56) References Cited

U.S. PATENT DOCUMENTS

| 4,038,104 A | 7/1977 | Tsutomu |
| 11,271,180 B2 | 3/2022 | Hammond et al. |

(Continued)

FOREIGN PATENT DOCUMENTS

| CA | 3098879 | 11/2019 |
| CN | 207017498 | * 2/2018 |

(Continued)

OTHER PUBLICATIONS

"U.S. Appl. No. 16/414,492, Final Office Action dated Jan. 25, 2021", 14 pgs.

(Continued)

*Primary Examiner* — Jayne L Mershon
(74) *Attorney, Agent, or Firm* — Schwegman Lundberg & Woessner, P.A.

(57) ABSTRACT

Visually undistorted thin film electronic devices are provided. In one embodiment, a method for producing a thin-film electronic device comprises: opening a scribe in a stack of thin film material layers deposited on a substrate to define an active region and an inactive region of the thin-film electronic device, the stack comprising at least one active semiconductor layer. The active region comprises a non-scribed area of the stack and the inactive region comprises a region of the stack where thin film material was removed by the scribe. The method further comprises depositing at least one scribe fill material into a gap opened by the scribe. The scribe fill material has embedded therein one or more coloring elements that alter an optical characteristics spectrum of the inactive region to obtain an optical characteristics spectrum of the active region within a minimum perceptible difference for an industry defined standard observer.

20 Claims, 10 Drawing Sheets

Related U.S. Application Data

(60) Provisional application No. 62/673,427, filed on May 18, 2018.

(51) Int. Cl.
    *H01L 51/00*         (2006.01)
    *H01L 31/0465*     (2014.01)

(56) References Cited

U.S. PATENT DOCUMENTS

| | | | |
|---|---|---|---|
| 2002/0050286 A1* | 5/2002 | Kubota | B32B 27/306 |
| | | | 257/E27.125 |
| 2011/0240118 A1 | 10/2011 | Beatty | |
| 2014/0345673 A1 | 11/2014 | Van Hest et al. | |
| 2015/0303326 A1* | 10/2015 | Cheng | H01L 31/042 |
| | | | 438/69 |
| 2016/0049904 A1 | 2/2016 | Sasaki | |
| 2020/0028104 A1 | 1/2020 | Hammond et al. | |

FOREIGN PATENT DOCUMENTS

| | | |
|---|---|---|
| CN | 112567534 | 3/2021 |
| EP | 0986109 | 3/2000 |
| EP | 3794645 | 3/2021 |
| WO | 2019222517 | 11/2019 |

OTHER PUBLICATIONS

"U.S. Appl. No. 16/414,492, Non Final Office Action dated Aug. 20, 2020", 12 pgs.

"U.S. Appl. No. 16/414,492, Response filed Nov. 13, 2020 to Non Final Office Action dated Aug. 20, 2020", 17 pgs.

"U.S. Appl. No. 16/414,492, Restriction Requirement dated Jun. 26, 2020", 7 pgs.

"U.S. Appl. No. 16/414,492, Response filed Aug. 7, 2020 to Restriction Requirement dated Jun. 26, 2020", 8 pgs.

"CIE Standard Observers and calculation of CIE X, Y, Z color values", HUNTERLAB, Application Note AN 1002.00,, (2012), 4 pages.

"Measuring Color using Hunter L, a, b versus CIE 1976 L*a*b", HUNTERLAB, Application Note AN 1005.00, (2012), 4 pages.

"International Application Serial No. PCT US2019 032693, International Search Report dated Oct. 1, 2019", 5 pgs.

"International Application Serial No. PCT US2019 032693, Written Opinion dated Oct. 1, 2019", 11 pgs.

"International Application Serial No. PCT US2019 032693, International Preliminary Report on Patentability dated Dec. 3, 2020", 13 pgs.

"U.S. Appl. No. 16/414,492, Response filed Jun. 25, 2021 to Final Office Action dated Jan. 25, 2021", 11 pgs.

"U.S. Appl. No. 16/414,492, Advisory Action dated Jul. 13, 2021", 3 pgs.

"U.S. Appl. No. 16/414,492, Appeal Brief filed Sep. 23, 2021", 20 pgs.

"European Application Serial No. 19729602.3, Response filed Jul. 22, 2021 to Communication pursuant to Rules 161(1) and 162 EPC dated Jan. 12, 2021", 10 pgs.

"U.S. Appl. No. 16/414,492, Notice of Allowance dated Oct. 26, 2021", 7 pgs.

Myong, "Design of esthetic color for thin-film silicon semi-transparent photovoltaic modules", Solar Energy Materials and Solar Cells, Elsevier, (Jul. 27, 2015), pp. 442-449.

U.S. Appl. No. 16/414,492 U.S. Pat. No. 11,271,180, filed May 16, 2019, Visually Undistorted Thin Film Electronic Devices.

\* cited by examiner

VISUALLY UNDISTORTED THIN FILM ELECTRONIC DEVICES

CROSS-REFERENCE TO RELATED APPLICATIONS

This is a United States Patent Application which is a divisional application to U.S. patent application Ser. No. 16/414,492, filed on May 16, 2019, which claiming priority to, and the benefit of, U.S. Provisional Patent Application No. 62/673,427, titled "VISUALLY UNDISTORED THIN FILM ELECTRONIC DEVICES" filed on May 18, 2018, each of which are incorporated herein by reference in their entirety.

JOINT RESEARCH AGREEMENT

The presently claimed invention was made by or on behalf of the below listed parties to a joint research agreement. The joint research agreement was in effect onor before the date the claimed invention was made and the claimed invention was made as a result of activities undertaken within the scope of the joint research agreement. The parties to the joint research agreement are SolorWindow Technologies, Inc. and Alliance for Sustainable Energy, LLC.

GOVERNMENT RIGHTS

The United States Government has rights in this invention under Contract No. DE-AC36-08GO28308 between the United States Department of Energy and Alliance for Sustainable Energy, LLC, the manager and operator of the National Renewable Energy Laboratory.

BACKGROUND

Industrial scale thin film devices, such as photovoltaic modules, typically comprise a stack of thin film layers applied to a substrate. To ensure high performance over large areas, the Mack of thin film layers is subdivided, or "patterned" using a scribing methodology into a plurality individual device cells, and materials deposited into the scribed regions to form monolithic interconnections that electrically interconnect the individual device cells. The scribing process, in opening up the scribed regions between device cells, involve the removal of one or more of the previously deposited thin film layers in the region where the scribe is formed. The materials deposited into the scribed regions, will comprise electrically insulating materials, electrically conducting materials, or some combination of both electrically insulating and electrically conducting materials applied in layers.

One problem associated with thin film devices patterned with scribes and monolithic interconnections is that the patterning disrupts the uniform appearance of the thin film materials applied across the substrate. The visual distortions produced by these disruptions is a particularly problematic defect for semi-transparent photovoltaic modules intended for use in building integrated photovoltaics, such as windows or glass curtain walls, where distortion free clarity and aesthetic characteristics are highly scrutinized by architects and engineers, and builders. Visually obvious distortions caused by thin film device patterning is also considered a defect in opaque thin film photovoltaics modules, such as used for spandrel glass panels, which are designed to be opaque in order to hide equipment or other features between the floors of a building.

For the reasons stated above and for other reasons stated below which will become apparent to those skilled in the art upon reading and understanding the specification, there is a need in the art for visually undistorted thin film electronic devices.

SUMMARY

The Embodiments of the present disclosure provide methods and systems for visually undistorted thin film electronic devices and will be understood by reading and studying the following specification.

In One embodiment, a method for producing a thin-film electronic device comprises: opening a scribe in a. stack of thin film material layers deposited on a substrate to define an active region and an inactive region of the thin-film electronic device, wherein the stack of thin film material layers comprise at least one active semiconductor layer, wherein the active region comprises a non-scribed area of the stack of thin film material layers, wherein the inactive region comprises a region of the stack of thin film material layers where thin film material was removed by the scribe; and depositing at least one scribe fill material into a gap opened by the scribe, wherein the scribe fill material has embedded therein one or more coloring elements, wherein the one or more coloring elements alter an optical characteristics spectrum of the inactive region to obtain an optical characteristics spectrum of the active region within a minimum perceptible difference for an industry defined standard observer.

DRAWINGS

Embodiments of the present disclosure can be more easily understood and further advantages and uses thereof more readily apparent, when considered in view of the description of the preferred embodiments and the following figures in which.

In accordance with common practice, the various described features are not drawn to scale but are drawn to emphasize features relevant to the present disclosure. Reference characters denote like elements throughout figures and text.

DETAILED DESCRIPTION

In the following detailed description, reference is made to the accompanying drawings that form a part hereof. Specific illustrative embodiments are presented in which the embodiments may be practiced. These embodiments are described in sufficient detail to enable those skilled in the art to practice the embodiments, and it is to be understood that other embodiments may be utilized, and that logical, mechanical and electrical changes may be made without departing from the scope of the present disclosure. The following detailed description is, therefore, not to be taken in a limiting sense.

Embodiments of the present disclosure address the problem of visual distortions caused by patterning of thin film modules through the introduction of coloring elements embedded within scribe fill material that is deposited into gaps where thin film layers were removed. The spectral qualities of these coloring elements, in combination with the spectral qualities of the scribe fill material in which they are embedded, reintroduce the spectral qualities of the thin film material removed during patterning so that when they are applied into the gaps, the scribed region and the thin film device cell are visually indistinguishable to the human observer. It should be appreciated that embodiments of the present disclosure are not limited to the use of coloring element embedded materials used between thin film device cells where monolithic interconnections are formed. Other embodiments may address optical characteristics and color matching in other regions of the devices, such as in materials used for edge isolation or sealing of a device. It should also be appreciated that coloring elements may refer to either additive coloring elements or subtractive coloring elements. Coloring elements such as pigments or dyes embedded within the scribe fill materials will selectively absorb some wavelengths of incident light while reflecting or transmitting others. For example, in some embodiments involving semi-transparent devices, additive coloring elements may be utilized. In some embodiments involving opaque devices, subtractive coloring elements may be utilized. In still other embodiments, combinations of additive coloring elements and subtractive coloring elements may be utilized. It should also be understood that application of the embodiments described herein are not limited thin film device cells comprising photovoltaic devices, but may be applied to limited thin film device cells forming other active electronic devices such as, but not limited to, light emitting diodes or transparent human interface display screens for computer applications.

Figure 1:
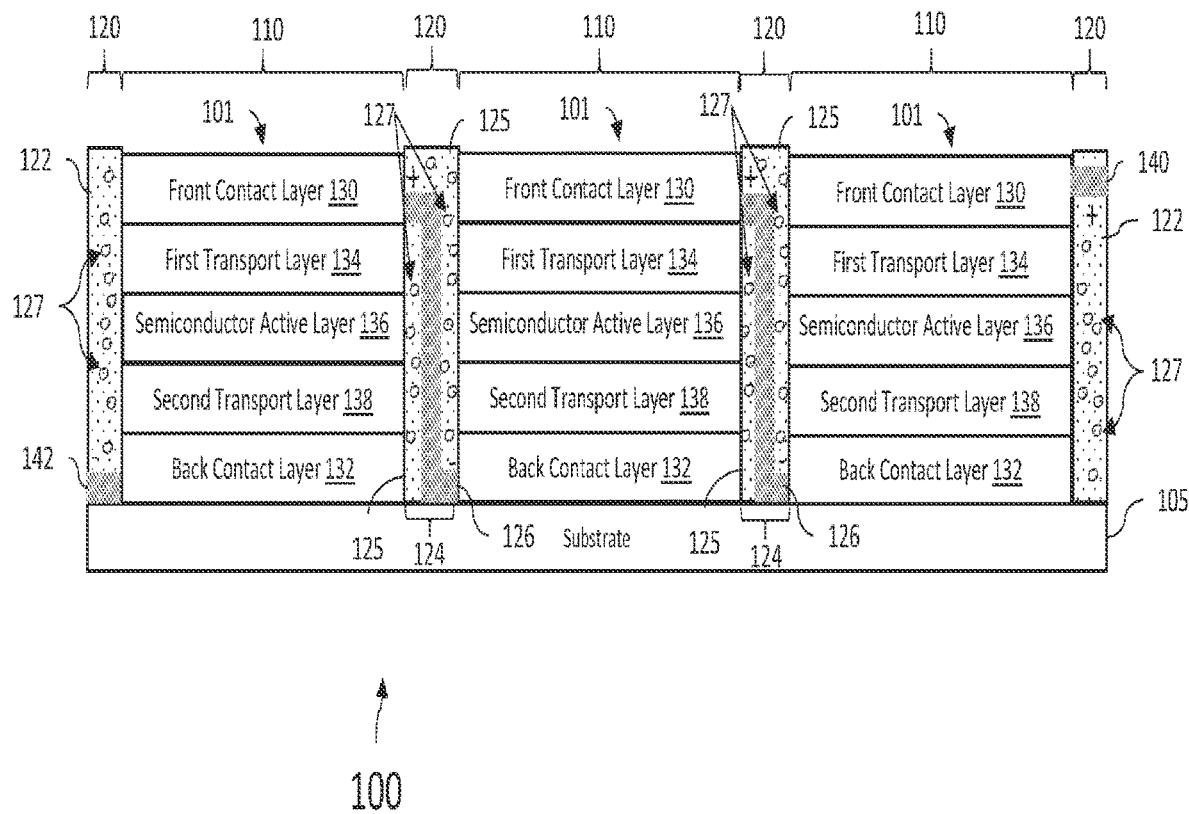
FIG. 1 is a diagram illustrating a thin film semiconductor device of one embodiment of the present disclosure.

FIG. 1 is a diagram illustrating a thin film electronic device 100 of one embodiment of the present disclosure. It should be understood that the disclosure provided herein is applicable to any form of thin film electronic device, including any form of thin film semiconductor device, where visually obvious distortions caused by thin film device patterning is a problem. As such, the embodiments disclosed in this specification drawn to organic photovoltaic (OPV) thin film electronic devices are presented to provide specific example embodiments. It should therefore be understood, however, that the scope of embodiments is not limited by these examples to just organic thin-film electronic devices or to photovoltaic thin film electronic devices.

In some implementations, device 100 is a semi-transparent organic device that may be used, for example in a building-integrated photovoltaics application (such as a glass window unit) that allows natural lighting into an interior space of a building or a vehicle. In other implementations, device 100 comprises an opaque thin film photovoltaics module, such as used for spandrel glass panel for example. As shown in FIG. 1, device 100 comprises a plurality of individual device cells 101 fabricated on a substrate 105. In alternate implementations, substrate 105 may comprise a rigid or non-rigid semi-transparent material such as a glass pane, a sheet of acrylic or acrylic glass, rigid or flexible plastics (including plastics not otherwise classified as an acrylic), flexible glass, a semi-transparent plastic or film material, or alternately an opaque material such as a metal or ceramic, for example. Each of the device cells 101 define an active region 110 of device 100, comprising an active electronic device such as but not limited to an organic photovoltaic device. Other regions of device 100 define inactive regions, shown generally at 120. In some embodiments, the inactive regions 120 of device 100 may comprise edge seal materials (such as an electrically insulating edge seal material) as shown at 122. in some embodiments, the inactive regions may comprise monolithic electrical interconnects, which electrically couple adjoining device cells 101, as shown at 124 in either series or parallel combinations.

In particular, the device cells 101 include front and back contact layers 130 and 132, a first charge transport layer 134, an active semiconductor layer 136 and a second charge transport layer 138. In some embodiments, the first charge transport layer 134 may comprise a hole transport layer (HTL), hole collection layer (HCL), or hole-injection layer (HIL) while the second charge transport layer 138 comprises an electron transport layer (ETL), an electron collection layer (ECL), or an electron-injection layer (EIL). In other embodiments, the first charge transport layer 134 may comprise an ETL or ECL while the second charge transport layer 138 comprises a HTL or HCL. For semi-transparent implementations, front and back contact layers 130 and 132 may both comprise transparent contact layers. For example, front and back contact layers 130 and 132 may comprise transparent contact layers such as but not limited to indium zinc oxide (IZO), indium tin oxide (ITO), Aluminum doped Zinc Oxide (AZO), or Gallium doped Zinc Oxide (GZO) or other transparent conductive oxide (TCO), which may be deposited by magnetron sputtering, or other deposition method. The first and/or second charge transport layers 134 and 138 may comprise a transparent conducting polymer such as but not limited to poly(3,4-ethylenedioxythiophene) (PEDOT) which may be blended with a polystyrene sulfonate (PSS), or may comprise an oxide layer such as but not limited to tungsten trioxide ($WO_3$). Front and/or back contact layers 130 and 132 may also comprise a transparent high conductivity polymer, such as but not limited to a PEDOT:PSS layer. In other embodiments, one of the front contact layer 130 or the back contact layer 132 may comprise an opaque material.

The materials forming the various material layers may be sputter-deposited or deposited by other suitable methods such as but not limited to evaporative/vapor deposition or solution-processing methods. The exact composition of the semiconductor active layer 136 can vary, but may include, for example, an organic bulk heterojunction (BHJ) layer comprising a blend of an electron donor material (which may be a polymer and/or small molecules) and at least one electron acceptor material (which in different implementations may be a fullerene or other small molecule or polymer). Alternately the organic semiconductor active layer 136 may comprise an organic bilayer layer having a layered structure of electron donor material and electron acceptor material. In still other embodiments, active semiconductor layer 136 may comprise another active photovoltaic absorber thin film component such as a perovskite absorber layer.

For embodiments comprising a photovoltaic device, in operation, when light enters into the device cells 101 the absorber layer 136 generates electron and hole charges from absorbed photons. The electron and hole electrical charges are collected in the respective contact layers 130 and 132. The electrical interconnects 124 transport the charges to positive and negative terminals 140 and 142, which may be positioned at the edges of device 100. The positive and negative terminals 140 and 142 may in turn be coupled to one or more electronic devices (for example, electrical loads) in order to provide electrical power to the devices, and/or for storage of the energy generated by device 100. In still other embodiments, active semiconductor layer 136 comprises a non-photovoltaic device. For example, in some embodiments, active semiconductor layer 136 may comprise a photon emitter layer for a light emitting diode.

During fabrication of device 100, the stack of thin film materials that form the various device layers of the device cells 101 are deposited across substrate 105 and a series of scribes are cut at least partially into the deposited layers resulting in the inactive regions 120. The scribing process produces gaps where portions of the previously deposited thin-film material layers are removed. These scribes may subsequently be filled with different layers of scribe fill materials depending on the location and the purpose for opening the scribe. For example, scribes cut in order to define the edges of device 100 may be filled with an edge sealant material 122. Scribes cut in order to divide the layers of thin film into the pattern of individual device cells 101 may be filled with a series different electrically insulating and conducting materials in order to form the monolithic electrical interconnections 124 between adjacent device cells 101. In still other instances, scribes may be filled with electrically insulating and/or conducting materials in order to fabricate an electrical interface (such as terminals 140, 142) for electrically coupling the device 100 to external devices or systems. Other scribes may serve still other purposes.

Regardless of the particular reason a scribe was cut, the uniform appearance of the sheet of deposited thin film layers will be interrupted by creation of the scribes because the optical characteristics spectrum of the resulting inactive regions 120 where one or more of the thin film material layers has been removed will no longer match the optical characteristics spectrum of the active regions 110 that were not subjected to the scribing. It should be understood that as the term is used herein, an "optical characteristics spectrum" for a thin film stack of materials may alternately refer to either a visible light transmission (VLT) spectrum (which would be appropriate for transparent or semitransparent applications where the characteristics of light passing through the thin film stack is of importance) or to a reflection spectrum (which would be appropriate for an opaque application where the characteristics of light reflecting back from the thin film stack is of importance). Moreover, because individual inactive regions 120 may be scribed to different respective depths into the thin film layers, different inactive regions can have differing optical characteristics spectrum with respect to each other depending on which, and how much, of the previously deposited layers have been removed. Moreover, the scribe fill materials that are subsequently deposited into the scribed regions may each have their own inherent spectral characteristics. For example, scribes used in the fabrication of monolithic electrical interconnects 124 may have layers of electrically insulating material 125 and electrically conducting material 126 deposited within them to create the electrical interconnects 124. In some embodiments, additional and/or other materials may be deposited. As such, the resulting optical characteristics spectrum of such an inactive region 120 will be a function of both the optical characteristics spectrum of any remaining originally deposited material layers not removed by the scribe, and the optical characteristics spectrum of the scribe fill material subsequently deposited into the gap opened by the scribe. Any observable discontinuity from mismatched optical characteristics spectrums will be perceived as a visual distortion by an individual that looks at, or through, the device.

The degree to which the resulting inactive regions 120 are perceptibly visually distinguishable from the non-scribed active regions 110 is dependent on the deviation between the optical characteristics spectrum of the active regions 110 and the optical characteristics spectrum of the resulting inactive active regions 120. Accordingly, with embodiments of the present disclosure, the optical characteristics spectrum of the resulting inactive region 120 is adjusted by introducing coloring elements 127 into one or more of the scribe fill materials deposited into the scribes such that the optical characteristics spectrum of the resulting inactive region 120 substantially obtains the optical characteristics spectrum of the active region 110.

Figure 2:
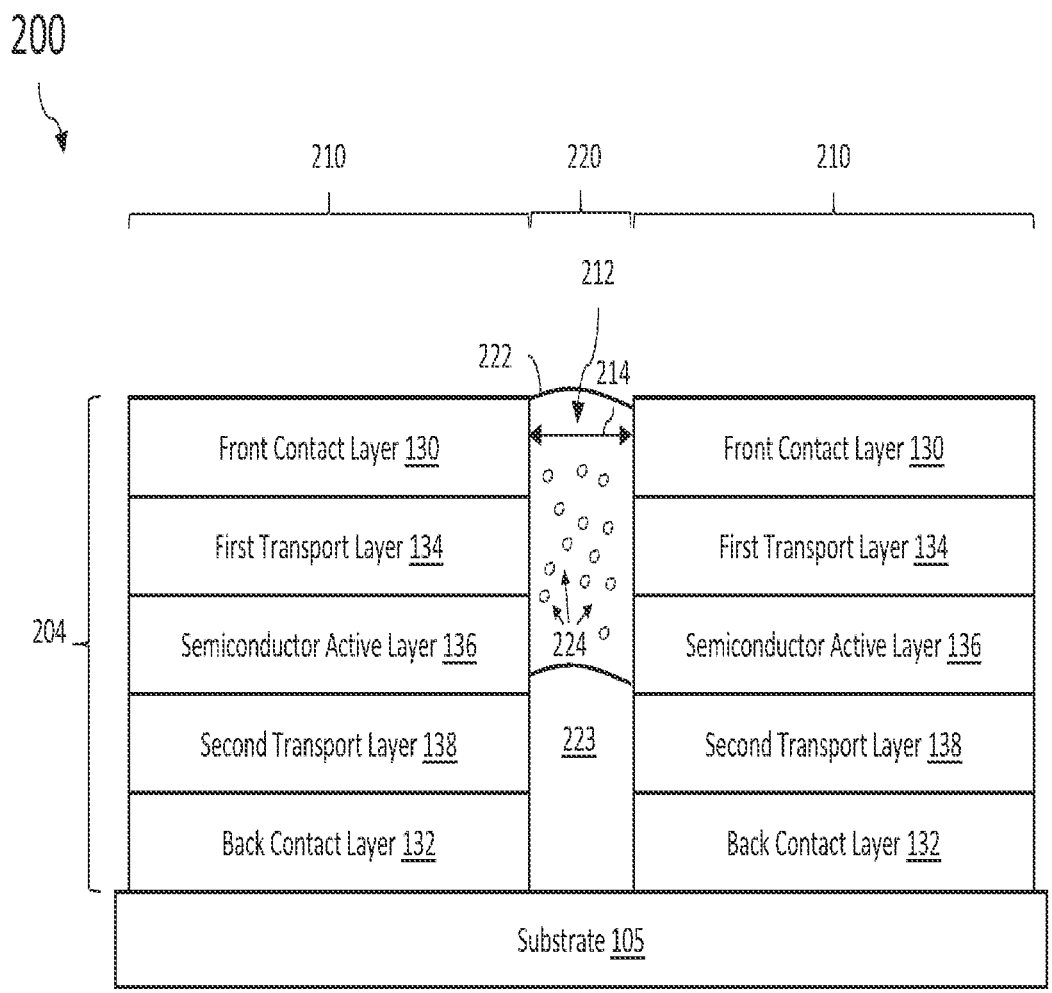
FIG. 2 is a diagram illustrating a thin film semiconductor device of one embodiment of the present disclosure.

FIG. 2 further details the example embodiment of the device 100 of FIG. 1. As such, elements described with respect to of FIG. 2 may be used in conjunction with, in combination with, or substituted for elements of any of the embodiments described above. Further, the functions, structures and oilier description of elements for such embodiments described above may apply to like named elements of FIG. 2 and vice versa. As shown generally at 200 in FIG. 2, a scribe 212 is opened to form a gap 214 within a stack of thin film device layers 204 to define an inactive region 220 where the scribe 212 was opened, and an active region 210 where the thin film device layers 204 remain intact. The individual material layers of active region 210 will each inherently comprise spectral characteristics, which in combination result in a composite of spectral characteristics that define an optical characteristics spectrum associated with the active region 210. When one or more scribe fill materials 222 are deposited into the gap 214, the inactive region 220 will obtain spectral characteristics that define an optical characteristics spectrum associated with the inactive region 220. As discussed above, in some instances, opening of the scribe 212 may remove a full column of the thin film device layers 204 completely down to the substrate 205. Alternatively, opening of the scribe 212 may only partially penetrate the thin film device layers 204 so that a portion of the original thin-film material layers 204 are not removed and remain within the inactive region 220 (shown at 223). Accordingly, the spectral characteristics and associated optical characteristics spectrum of the resulting inactive region 220 will be a function of the optical characteristics spectrum of any of the original material 223 not removed by the scribe 212 in combination with the optical characteristics spectrum of the scribe fill material 222 subsequently deposited into the gap 214. With embodiments of the present disclosure, the optical characteristics spectrum of the scribe fill material 222. is manipulated by augmenting the material with one or more coloring elements 224 embedded within the scribe fill material 222. By augmenting the scribe fill material 222 with coloring elements 224, the optical characteristics spectrums of inactive region 222 may be manipulated to obtain the optical characteristics spectrum of the active region 210 to a degree that visual differences between the regions is considered imperceptible with respect to an industry defined standard observer.

In some embodiments of the present disclosure, the coloring elements 224 may be embedded within scribe fill material 222 serving an electrical or other functional purpose. For example, the coloring elements 224 may be embedded within an electrically conducting scribe fill material (such as 126) and/or an electrical insulating scribe fill material (such as 125) which are being deposited into the gap in order fabricate a monolithic electrical interconnect 124 or electrical terminal 140 or 142. In other embodiments, the coloring elements 224 may be embedded within an otherwise inert additional scribe fill material 222 deposited mainly for the purpose of manipulating the optical characteristics spectrum of the inactive region 220. Such a coloring material may be deposited over other scribe fill material 222 having a function purpose such as for creating a monolithic electrical interconnect 124. It should be noted that deposition of additional scribe fill materials 222 comprising embedded coloring elements 225 may further function to protect against foreign material intrusion into gap 214 that could otherwise cause shorting across device cells, delaminating of active region thin film layers, or other potential defects. It should be appreciated that in still other embodiments, coloring elements 224 may be embedded within both scribe fill material 222 used to fabricate a monolithic electrical interconnect and within additional scribe fill materials 222 deposited into the gap 214.

Moreover, in some embodiments, multiple sets of coloring elements 224 are embedded into multiple different layers of the scribe fill material 222 to achieve a desired optical characteristics spectrum. For example, a first coloring element 224 may have superior solubility characteristics for deposition together with a first scribe fill material 222 while a second coloring element 224 may instead have superior solubility characteristics for deposition with a second scribe fill material 222. If the combination of both coloring elements 224 is needed to achieve the desired optical characteristics spectrum in the inactive region 220, the first set of coloring elements may be embedded in the first scribe fill material 222 while the second set of coloring elements is embedded in the second scribe fill material 222.

In any of ways described above, the optical characteristics spectrum of the inactive region 222 may thus be manipulated so that the optical characteristics spectrums of the active region 210 and inactive region 220 sufficiently match in order to produce a uniform appearance across the module free from distortions due to color discontinuities to an industry defined standard observer. As the term is used herein, an optical characteristics spectrum for a material refers to both an amount of light transmission (or reflectance) as well as the spectral profile of wavelengths across visual spectrum of light emanating from the material. The visual spectrum is typically defined as light comprising wavelengths from approximately 380 nm to 680 nm. While this specification adopts the standards and definitions as published by the International Commission on Illumination (CIE) for the purpose of providing illustrative examples, it should be understood that the embodiments described herein may still be practiced by instead referring to other alternative Colorimetric standards.

Given a selected CIE standard light source, the amount of light reflected or transmitted from an object at each wavelength of the visual light spectrum can be quantified in order to establish a spectral curve that defines the objects color characteristics. Moreover, the human eye is not uniformly sensitive to light across the visual spectrum, but is more sensitive to some colors than others. As such, industry standards define a Standard Colorimetric Observer (for example, the CIE 10 degree Standard Observer), which comprises $\bar{x}$, $\bar{y}$ and $\bar{z}$ functions that quantify the red, blue and green cone sensitivity of the average human observer for a standard light source in order to arrive at the industry defined standard observer to establish objective colorimetric metrics.

Tristimulus color values (also referred to as color coordinates) X, Y and Z may be calculated by multiplying each of these three standard observer functions (i.e., $x\bar{x}$, $\bar{y}$ and $\bar{z}$) respectively by the CIE illuminant and by the transmittance (or if applicable, reflectance) of the object, and then summing that product over the wavelengths of the visible spectrum to arrive at the X, Y and Z color coordinates. One skilled in the art who has studied this disclosure would understand that these X, Y and Z color coordinates may be mathematically mapped into any desired color space (for example, the Hunter L, a, b color space, or the CIE L*, a*, b* color space) in order to perform calculations for comparing colors to determine how well two colors match. The optical characteristics spectrum of an object can therefore be defined in terms of a coordinate vector comprising the X, Y and Z color coordinates. In some embodiments of the present disclosure, a baseline optical characteristics spectrum for the active regions 110 of device 100 may thusly be obtained by determining the X, Y and Z color coordinates for those active regions 110. This baseline optical characteristics spectrum will serve as a target optical characteristics spectrum to which the X, Y and Z color coordinates of the inactive regions 110 are engineered by augmenting the scribe fill materials 222 with coloring elements 224.

In general, what is considered an acceptable color match between two sample objects often varies depending on the application. However, for the purpose of industrial building and architectural window applications, any difference between the optical characteristics spectrum of active regions 110 and inactive regions 120 need to be at or below a minimum perceptible limit (which may be referred to as a minimum perceptible difference) in order to provide the distortion free window clarity expected to meet industry standards.

An objective metric to establish the degree of closeness between two optical characteristics spectra for the industry defined standard observer may be calculated as a function of the distance between two sets of measurements within the three dimensional color space. For example, given color coordinates for an active region 110 and color coordinates for an inactive region 120, in the CIE L*, a*, b* color space, rectangular color differences $\Delta L^*$, $\Delta a^*$, $\Delta b^*$ may be readily determined. If $\Delta L^*$ is positive, then the inactive region 120 is lighter than the active region 110. If negative, then the inactive region 120 is darker than the active region 110. If $\Delta a^*$ is positive then then the inactive region 120 is more red, or less green, than the active region 110. If $\Delta a^*$ is negative, then the inactive region 120 is more green, or less red, than the active region 110. If $\Delta b^*$ is positive then the inactive region 120 is more yellow and less blue than the active region 110. If $\Delta b^*$ is negative, then the inactive region 120 is more blue and less yellow than the active region 110. As has been noted, however, the minimum perceptible difference between two colors is not uniform for all wavelengths across the visual spectrum. For that reason, CIE has defined the parameter $\Delta E$ (Total Color Difference) to establish a standard calculation metric which correlates human visual judgement with the differences between two perceived colors. At the time of this disclosure, the parameter "Delta E 2000," or ΔE2000, is considered the most accurate CIE color difference algorithm available for determining the detectability by a human being of the difference between any two colors in the visual spectrum.

While it is difficult to obtain a perfect optical characteristics spectrum match throughout the visible spectrum between adjacent active and inactive regions, perfection is not necessary to obtain a color matching within the minimum perceptible difference. The embodiments presented herein may be used to obtain color matching that is quite close (for example ≤5% deviation) across the visual light spectrum, with optionally tighter matching standards (for example ≤2%) for matching in those regions of the visual light spectrum where the human eye is most sensitive in detecting color differences. Based on the ΔE2000 standard, a minimal detectable difference between two colors in the visual spectrum may be considered to occur between a ΔE2000 of 1-3, with a ΔE2000 value of 1 defined as essentially imperceptible by anyone other than experienced professional glass inspectors.

Accordingly, with embodiments of the present disclosure, the X, Y and Z color coordinates of the inactive regions formed by within the scribes may be modified by embedding coloring elements 224 into scribe fill materials 222 so that the X, Y and Z color coordinates of the inactive regions 120 match the X, Y and Z color coordinates of the active regions 110 within a ΔE2000 of 3 or less, producing an acceptably distortion free glass sheet that comprises an active electronic module across its surface for use in building applications. In some embodiments, deviations between the active region and an adjacent inactive region may be considered within a minimum perceptible difference for an industry defined standard observer for ΔE2000≤3.

Figure 3:
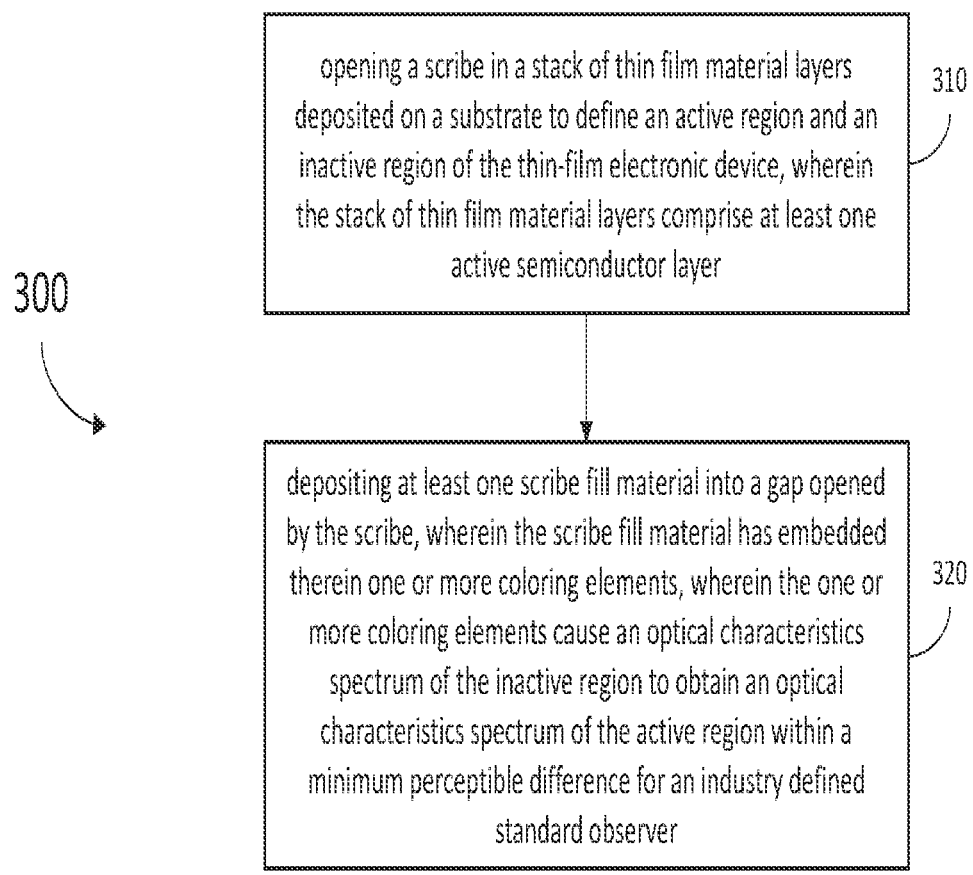
FIG. 3 is a diagram illustrating a method of one embodiment of the present disclosure.

FIG. 3 is a flow chart illustrating a method 300 for fabricating visually uniform thin film electronic devices of one embodiment of the present invention. It should be understood that method 300 may be implemented in conjunction with any of the embodiments described above with respect to FIGS. 1 and 2. As such, elements of method 300 may be used in conjunction with, in combination with, or substituted for elements of those embodiments described above. Further, the functions, structures and other description of elements for such embodiments described above may apply to like named elements of method 300 and vice versa.

The method 300 begins at 310 with opening a scribe in a stack of thin film material layers deposited on a substrate to define an active region and an inactive region of the thin-film electronic device, wherein the stack of thin film material layers comprises at least one active semiconductor layer. The active region comprises a non-scribed area of the stack of thin film material layers and the inactive region comprises a region of the stack of thin film material layers where thin film material was removed by the scribe. The method 300 proceeds to 320 with depositing at least one scribe fill material into a. gap opened by the scribe, wherein the scribe fill material has embedded therein one or more coloring elements, wherein the one or more coloring elements alter an optical characteristics spectrum of the inactive region to obtain an optical characteristics spectrum of the active region that is within a minimum perceptible difference for an industry defined standard observer.

The scribing performed at 310 may be performed using one of several techniques that would be known to those in the art. In some embodiments, the scribing is performed as a localized process using a laser or mechanical scribe to selectively remove layers of the previously deposited thin film layers. In some embodiments the color augmented scribe fill material deposited into the scribe at 320 may be applied using localized deposition techniques such as aerosol jet printing or ink jet printing. Both of these techniques have the advantage of being able to locally deposit materials to select areas, can be used to precisely control the amount of materials deposited, and are compatible with high throughput manufacturing techniques. It should be understood however that the embodiments presented herein are not limited to aerosol jet printing and/or ink jet printing. In other embodiments, printing techniques such as, but not limited to, screen printing, gravure printing, and spectrographic micro contact printing may be used to deposit color element augmented materials.

In one embodiment, the method 300 may include obtaining a baseline optical characteristics spectrum for an unscribed region of stack of thin film material layers and an optical characteristics spectrum for any material remaining within a scribe from which at least a portion of the thin film material layers was removed. The difference between these two optical characteristics spectrums may be used to define desired aggregate color characteristics of the scribe fill material that will be added back to the scribed region. The color characteristics of the scribe fill materials can be color matched to the color characteristics of the material removed by the scribing process, so that the resulting scribed inactive region will color match the unscribed active region. In some embodiments, to determine what coloring elements need to be added, the intrinsic color characteristics of the scribe fill materials is established. Then the scribe fill material is augmented with embedded coloring elements that will drive the optical characteristics spectrum of the scribe fill material to the optical characteristics spectrum of the material removed by scribing.

It should be appreciated that, given the target optical characteristics spectrum the scribe fill material, one skilled in the art of colorimetry in thin film applications would be able to determine what combinations of dyes and/or pigments would best serve as the coloring elements to be embedded in the scribe fill material to converge on and obtain the optical characteristics spectrum of the material removed. For example, for semitransparent applications, the coloring elements may comprise a combination of individual red, blue, and green dyes. The particular combination is formulated ahead of time and embedded within the materials prior to their deposition into the scribe region.

It should be understood that the augmented scribe fill materials may, but may not necessarily, achieve the final target optical characteristics spectrum immediately at the time of deposition. That is, in some embodiments depending on the material characteristics of the coloring elements and the scribe fill materials, the target optical characteristics spectrum may be obtained by the method 300 further comprising aging, curing, or otherwise processing the deposited scribe fill materials to bring the material to the target optical characteristics spectrum. For example, the color augmented scribe fill material deposited into the scribe at 320 may be subjected to heat and/or light treatments, or other treatments, that cause changes to the spectral qualities of one or more of the coloring elements embedded within scribe fill material. For example, one or more of the coloring elements may change with respect to color, saturation, or opaqueness. In some embodiments, such a post deposition process may cause coloring elements embedded within scribe fill material to interact with each other, or other components of the scribe fill materials, to bring the material to the target optical characteristics spectrum. Although in some embodiments such post deposition process may occur as part of the fabrication process of the thin film electronic device, in other embodiment it may occur in whole or in part after fabrication is complete. For example, in some embodiments it would be understood that the color augmented scribe fill material may change with respect to color, saturation, or opaqueness in-situ after the device is installed. In such embodiments, exposure to expected ambient lighting and/or heating can comprise part of a post deposition process for obtaining steady-state spectral qualities with the target optical characteristics spectrum.

Manipulating the optical characteristics spectrum of the scribe fill material using embedded coloring elements can be accomplished in a number of different ways. In one embodiment, samples of thin-film materials used in the device cell 101 can be incorporated as a coloring element into scribe fill material. The use of such material as coloring elements would need to be measured so as to not alter the electrical characteristics of the scribe fill material in a detrimental manner. For example, where the scribe fill material is being introduced into the scribe to provide an electrical insulator, the scribe fill material would need to comprise such samples at a low enough loading so as not to disrupt the scribe fill material's insulating properties. In some embodiments, the optical characteristics spectrum of the scribe fill material could be roughly adjusted using samples of the semiconductor active layer material, and additional coloring elements embedded to fine-tune to account for the color characteristics for other device layers. In some implementations, due to the reduced loading of the semiconductor active layer material in the scribe fill material, the amount of scribe fill material deposited might exceed the thickness of surrounding thin-film layers, but this is acceptable as a scribe fill material insulator could be over-printed to ensure complete isolation.

Example scribe fill material which may be used to form insulating (e.g. dielectric) layers within a scribed area include, but are not limited to, organic polymers such as poly(styrene), poly (methyl methacrylate), poly(vinyl acetate), poly(vinyl alcohol), organic-inorganic hybrid materials, such as organosiloxane metal-organic frameworks, or inorganic polymers such as siloxanes or thyroxine, or ceramics materials which may be suitable for non-transparent applications, or combinations thereof. Example material which may be used for scribe fill material to form conducting layers within a scribed area include, but are not limited to, semitransparent conductors and materials such as indium tin oxide (ITO) nanoparticles, transparent conducting oxide (TCO) nanoparticles and other semitransparent conductor or semiconducting organic polymers, or opaque conductors such as silver (Ag), or other metal, nanoparticles, nanowires, or flakes, or combinations thereof.

The color elements used for manipulating the optical characteristics spectrum of the scribe fill material may be selected not only based on their coloring characteristics, but also on other material properties (for example, hardness and/or flexibility) and on their overall compatibly with the material in which they will be deposited with and embedded within. In some embodiments, the materials selected to be coloring elements should have common solubility characteristics as the scribe fill material in which it will be embedded. That is, the coloring elements are ideally soluble in the same solvents as the scribe fill material so that they may be mixed together prior to deposition. If the scribe fill material is soluble in water, then the coloring elements selected for embedding within that scribe fill material should also be soluble in water. Similarly, if the scribe fill material is soluble in an organic solvent, then the coloring elements selected for embedding within that scribe fill material should also be soluble in the same organic solvent. For example, one skilled in the art of water-soluble dyes could start with a target optical characteristics spectrum (which may be defined in terms of a set of color coordinates as discussed above) for a desired water-soluble scribe fill material. Given that target optical characteristics spectrum, they could then choose from a selection of dyes and/or pigments that are soluble in water to combine with the water-soluble scribe fill material to arrive at a scribe fill material that will achieve the target optical characteristics spectrum. Similarly, given a target optical characteristics spectrum, one skilled in the art of organic solvent soluble dies could then choose from a selection of dies and/or pigments that are soluble in an organic solvent to combine with a scribe fill material soluble in the organic solvent to arrive at a scribe fill material that will achieve the target optical characteristics spectrum. Thus, depending on the insulator material chosen and its solubility in various solvents, this will influence the choice of coloring elements used. Most thin-film absorber materials are unlikely to be water-soluble, but many common commercial dyes, such as food dyes, are water soluble. If no matching solvent can be identified, in some embodiments, the coloring elements and insulator could be printed separately and be layered on top of each other.

As discussed above, the color augmented scribe fill material may be selectively placed within and/or above a specific scribe using area-selective printing techniques with high resolution. For example, aerosol jet printing and inkjet printing are two deposition techniques that allow flexible control of the amount of insulator deposited. Other printing techniques, such as: screen, gravure, meyer rod, flexographic, and microcontact printing may also be utilized in alternate embodiments. All of these techniques utilize an ink to enable the printing process, with each process requiring slightly different ink properties. Generally speaking, however, an ink used to deposit a color augmented scribe fill material will have broadly similar properties and include a solvent, a scribe fill material (whether an insulator (dielectric) or conductor) soluble in the solvent, and the coloring elements (which are soluble in the solvent chosen) to produce the target optical characteristics spectrum desired. It should be understood however, that in some cases the components of the ink may not be required to be soluble, for example if a stable suspension may be formed that can be printed by one or more of the above techniques.

It would also be understood that the unscribed layers of the active region 110 will need to be able to withstand application of the ink solvent without substantive damage, or else the printing process might detrimentally affect the performance of device 100. Additional additives such as surfactants, adhesion promoters, crosslinkers, or others may be added to the ink as well.

After a suitable ink for depositing the color augmented scribe fill material has been developed and a suitable printing process chosen, an example process can be described as follows: A thin-film photovoltaic module is prepared by depositing the stack of thin film layers. A scribe is performed (such as a P3 scribe or equivalent, for example) and the ink comprising the color augmented scribe fill material is printed inside of the scribe to the necessary thickness to produce a good match in optical characteristics spectrum and intensity to the surrounding active regions. Where a transparent contact material was placed inside of a P2 scribe, this material can also be over-printed with a suitable ink comprising another color augmented scribe fill material to similarly reduce or eliminate the optical characteristics spectrum and intensity mismatch between the P2 scribe and the surrounding active regions. In some embodiments, an anneal or other post-deposition treatment (for example, an ultra-violet light exposure) may be used to set the insulator in place. The result should be a good match in optical characteristics spectrum and intensity across the P3, and optionally the P2 scribe, while also providing the necessary insulating protection across the P3 scribe (shunt resistance), and between the P2 conductor and the surrounding environment. The optical characteristics spectrum matching should enhance the uniform appearance of the device 100 while also ensuring adequate module performance. This example refers to P2 and P3 scribes defined by the conventional P1, P2, and P3 scribing method known by those in the art for fabricating a monolithic interconnect. However, the introduction of color-matching as now disclosed in the present disclosure can also be applied to alternative monolithic interconnect configurations and thin film structures in order to eliminate visual defects caused by optical characteristics spectrum discontinuities.

Figure 4:
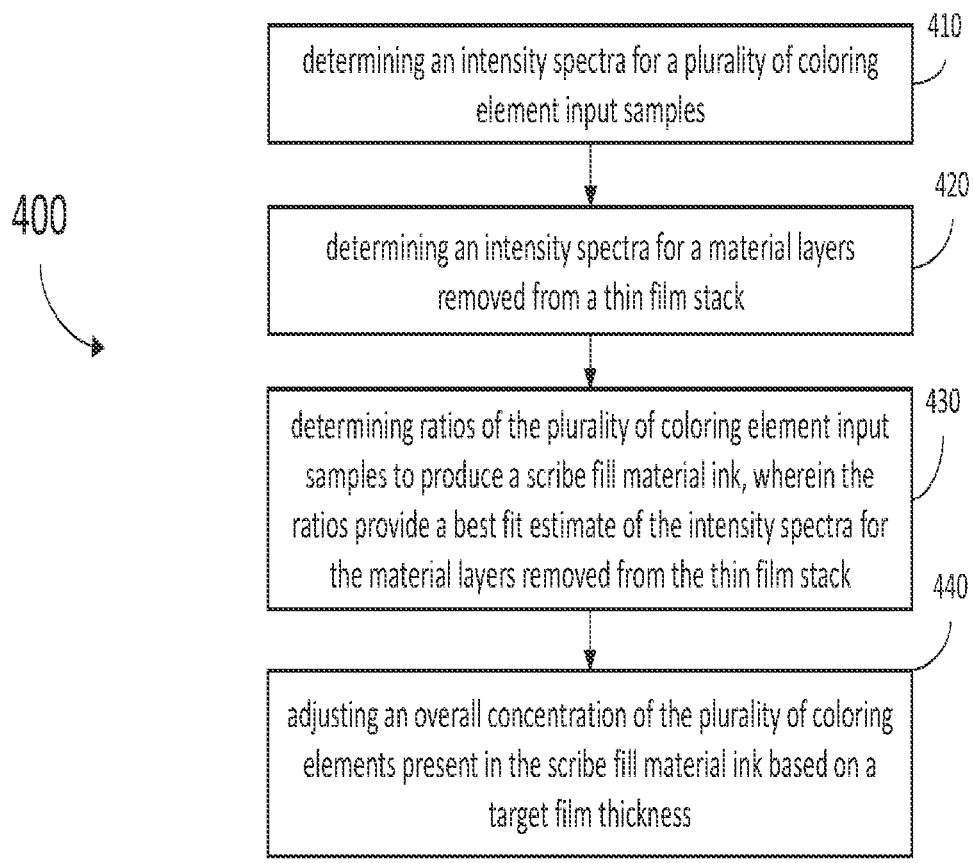
FIG. 4 is a diagram illustrating a method of one embodiment of the present disclosure.
Figure 5:
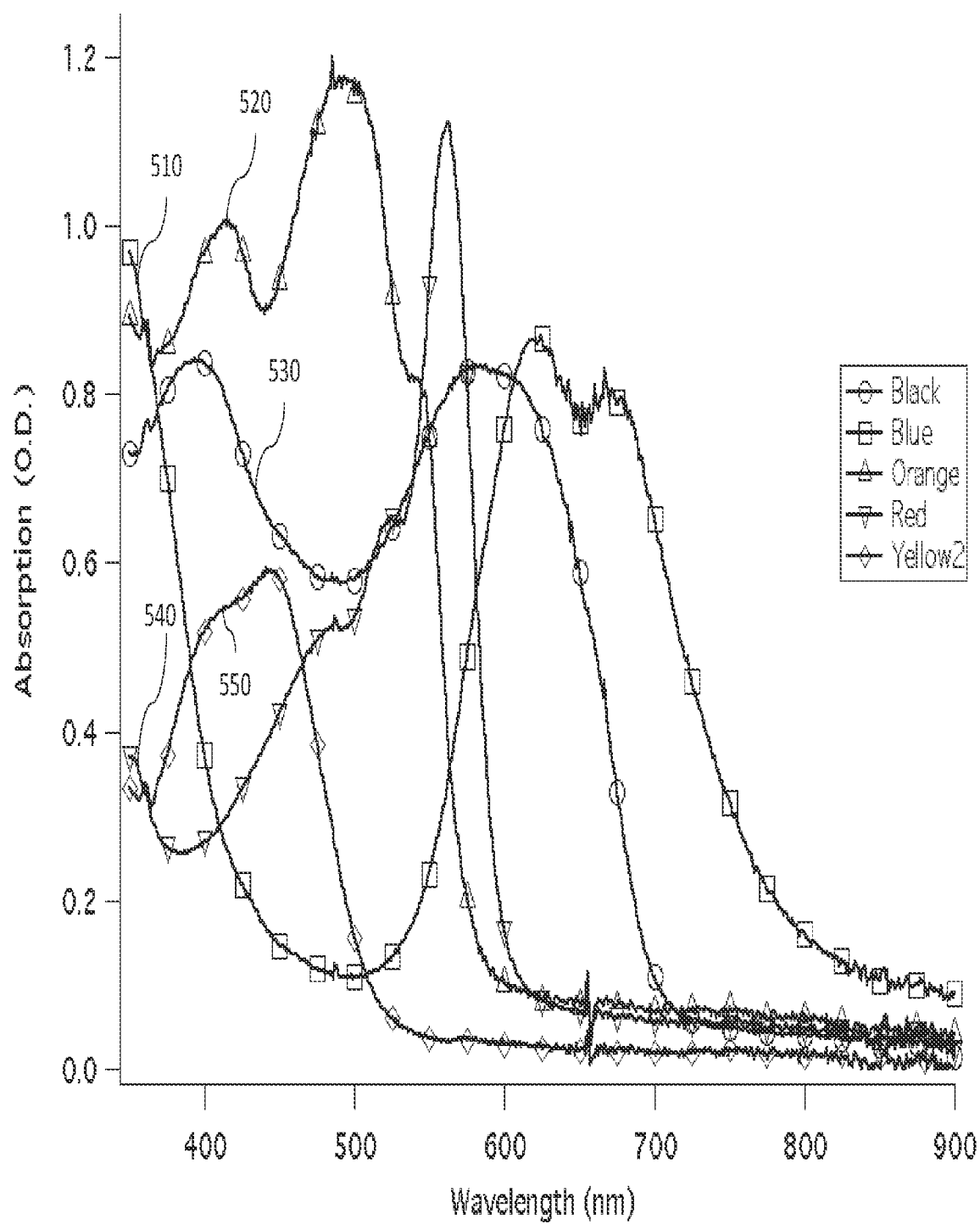
FIG. 5 is a diagram illustrating intensity spectra for coloring elements for one embodiment of the present disclosure.

FIG. 4 is a flow chart illustrating a method 400 for fabricating a suitable ink for depositing color augmented scribe fill material. The method begins at 410 with determining an intensity spectrum for a plurality of coloring element input samples. As the term is used herein, an "intensity spectrum" may alternately refer to either an absorption spectrum, a transmission spectrum, or a reflection spectrum. It should be understood that although the illustrative examples described herein primarily involve the determination of absorption spectra, one skilled in the art could readily apply the teachings disclosed herein for applications where determinations of transmission spectra, or reflection spectra are more desirable or appropriate. In this particular example embodiment, to determine an absorption spectrum, a plurality of available coloring elements are each dissolved into separate samples of the scribe fill material in order to produce a plurality of individual coloring element input samples, one for each of the available coloring elements. The absorption spectrum for each of the coloring element input samples is measured in terms of intensity of absorption (or Optical Density, O.D.) verses wavelength. For example, FIG. 5 is a diagram illustrating absorption spectra 510-550 obtained during laboratory experiment from a set of industrial dyes (specifically, Blue (510), Orange (520), Black (530), Red (540) and Yellow2 (550), Intraplast® solvent-soluble dyes produced by Sensient® Technologies Corporation) in a PVAc film. For the purpose of obtaining these measurements, each coloring element input sample was applied as a thin film with a thickness approximately equal (for example, within an order of magnitude) to the expected thickness of scribe fill material needed to fill the target scribe (for example, on the order of 750 nm) onto a clear substrate.

Figure 6:
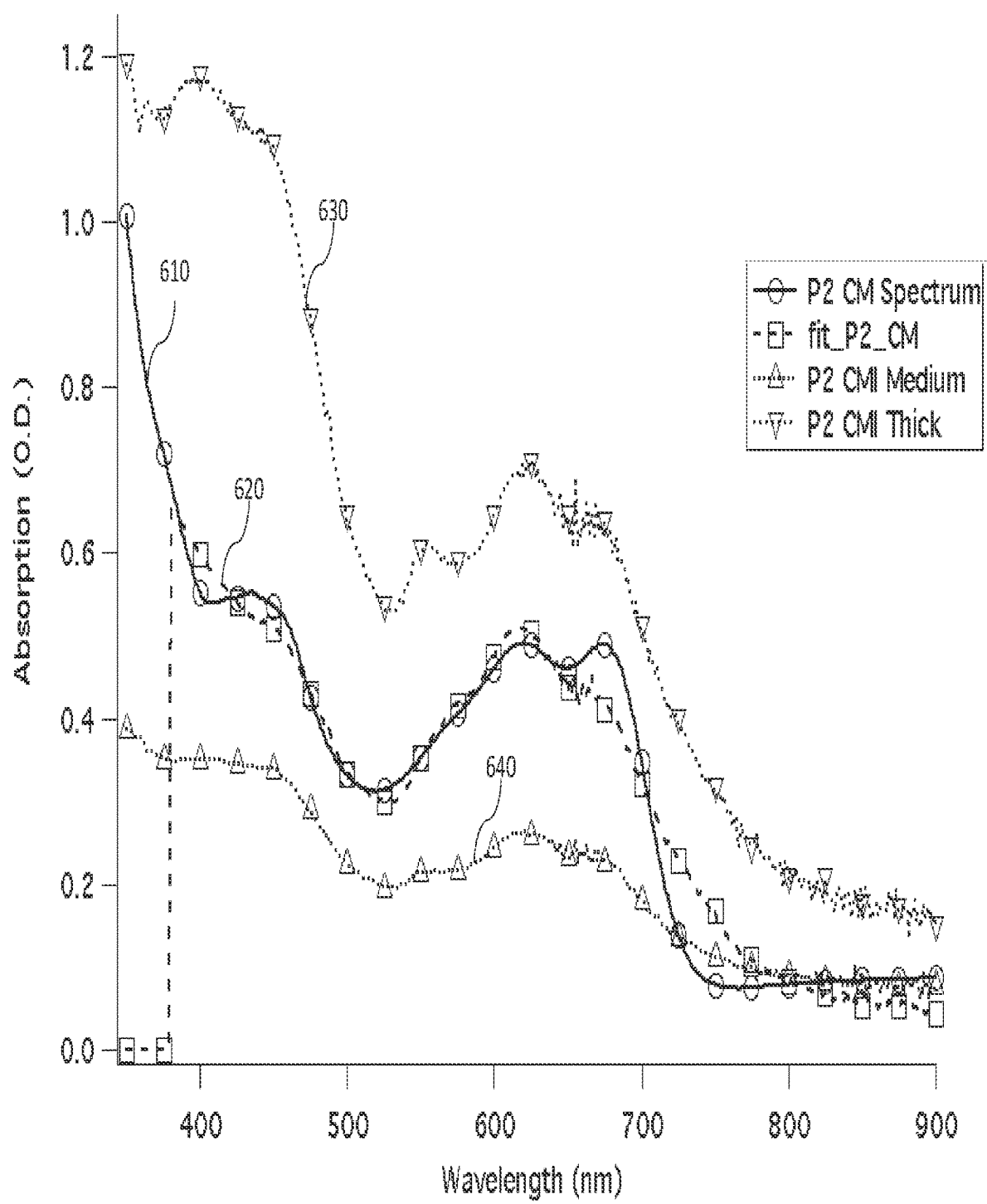
FIG. 6 is a diagram illustrating intensity spectra associated with a P2 scribe for one embodiment of the present disclosure.

The method proceeds to 420 with determining an intensity spectrum for material layers removed from a thin film stack. That is, the spectral qualities of the thin film material removed during patterning is determined. As discussed above, the difference in optical characteristics spectrum between a baseline optical characteristics spectrum for an unscribed region of stack of thin film material layers and an optical characteristics spectrum for any material remaining within a scribe may be used to define desired aggregate color characteristics of the scribe fill material to be added back to the scribed region. For example, FIG. 6 illustrates absorption spectra obtained during laboratory experiments where a standard P2 scribe was cut into a stack of thin film material layers. Curve 610 indicates the difference in VLT spectrum between the full stack of thin film material layers and the region where the P2 scribe was applied. Curve 610 thus provides the target color matching spectrum desired for the scribe material to be added back to the scribed region.

The method proceeds to 430 with determining ratios of the plurality of coloring element input samples to produce a scribe fill mated al ink, wherein the ratios provide a best fit estimate of the intensity spectra for the material layers removed from the thin film stack. Given the target color matching spectrum 610, the absorption spectra curves 510-550 may applied to a linear fit algorithm or other available data analysis software to determine the combination of the coloring element input samples that produces a best fit curve for the target color matching spectrum 610. In FIG. 6, curve 620 illustrates a curve fitting of the set of 5 coloring element input samples illustrated by absorption spectra 510-550 in FIG. 5 to the target color matching spectrum 610 for the P2 scribe. In this case, the coloring element input sample spectrum data and the target color matching spectrum data were input into the Igor Pro data analysis software program to calculate the best fit color matching curve 620 and generate corresponding least squares coefficient values that indicate the respective concentration ratios of the coloring element input samples that produce the best fit color match to the VLT spectrum difference represented by target color matching spectrum 610. The quality of the best fit color matching curve 620 was quite acceptable, especially in the 550-650 nm range, which is approximately the peak of the Photopic region.

The laboratory research thus confirmed that, a thin film of PVAc material embedded with these coloring element in the ratio indicated by the coefficient values of the linear fit, can be used to adjust the optical characteristics spectrum of the resulting inactive region for this P2 scribe, and adjust that optical characteristics spectrum to substantially obtain the optical characteristics spectrum of the non-scribed stack of thin film material layers. To follow-up the result, a solution was prepared of scribe fill material ink using coloring elements in the ratios prescribed by the coefficient values, with 1 wt. % of PVAc, and test films of two thicknesses prepared. Two thin films samples, of different thicknesses, were produced from this scribe fill material ink. The associated absorption spectra curve for the first thickness film is shown at 630 and for the relatively thicker second thickness curve is shown at 640. As shown by curves 630 and 640, the test films of scribe fill material were either slightly too thick or too thin to provide an exact match in optical density to the best fit color matching curve 620. However, the quality of the spectral match itself is evident and a more exact match in optical density achievable through adjustment of thickness.

Figure 7:
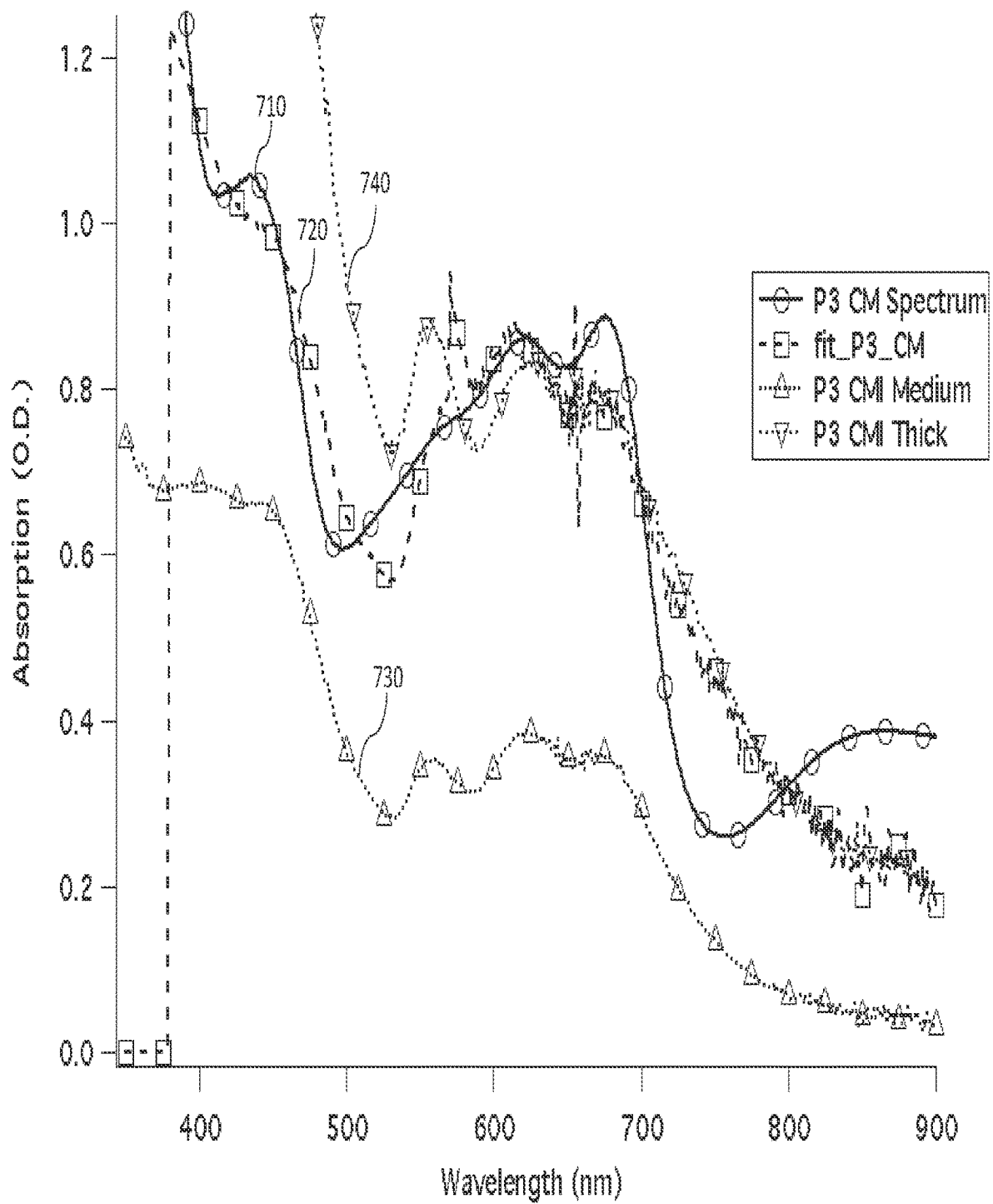
FIG. 7 is a diagram illustrating intensity spectra associated with a P3 scribe for one embodiment of the present disclosure.

Similar experiments were performed for a standard P3 scribe, as illustrated in FIG. 7. FIG. 7 illustrates absorption spectra obtained during a laboratory experiment where a standard P3 scribe was cut into a stack of thin film material layers. In this experiment, curve 710 indicates the difference in VLT spectrum between the full stack of thin film material layers and the region where the P3 scribe was applied. Curve 710 thus provides the target color matching spectrum desired for the scribe fill material to be added back to the scribed region. In this case, the same industrial dyes were used, so the same absorption spectra inputs 510-550 were applied to the linear fit algorithm to determine what combination of the coloring element input samples is needed to arrive at a best fit curve for the target color matching spectrum 710. The Igor Pro data analysis software program to calculate the best fit color matching curve 720 and the corresponding least squares coefficient values for the respective concentration ratios of the coloring element input samples that produce the best fit color match to the target color matching spectrum 710. A solution was again prepared of scribe fill material ink using coloring elements in the ratios prescribed by the coefficient values, with 1 wt. % of PVAc, and test films of two thicknesses prepared and spectrally measured as shown by curves 730 and 740. As shown by curves 730 and 740, the thicker test film 740 provided nearly the exact right optical density, though the quality of the spectral match was somewhat reduced as compared to the P2 scribe example in FIG. 6. Such a result, however, is not unexpected as a P3 scribe results in the removal of significantly more of thin film material layers. As a result, the embedded coloring elements contribute a greater role in the overall VLT spectrum of the resulting inactive region. Regardless, this experiment demonstrates the achievability of color matching the optical characteristics spectrum difference represented by target color matching spectrum for a P3 scribe.

In order to quantitatively analyze the quality of the coloring element embedded scribe fill material achievable from a scribe fill material ink conforming to the ratios of the best fit color matching curves, we calculated the CIE 1964 (10°) XYZ Tristimulus and xyz Chromaticity values for the P2 and P3 reference (Color-Match) spectra shown in the examples of FIGS. 6 and 7.

TABLE 1

Calculated Tristimulus, Chromaticity, and ΔE2000 Values for CMI Process

|  | X | Y | Z | x | y | z | ΔE2000 |
|---|---|---|---|---|---|---|---|
| P2 CM | 42.1565 | 47.9624 | 36.8982 | 0.3319 | 0.3776 | 0.2905 | n/a |
| P2 Fit | 41.9567 | 47.9665 | 37.9787 | 0.3280 | 0.3750 | 0.2969 | 1.1031 |
| P3 CM | 17.9057 | 21.5529 | 14.3717 | 0.3326 | 0.4004 | 0.2670 | n/a |
| P3 Fit | 17.7219 | 21.8758 | 13.6727 | 0.3327 | 0.4107 | 0.2567 | 1.8838 |

Figure 8:
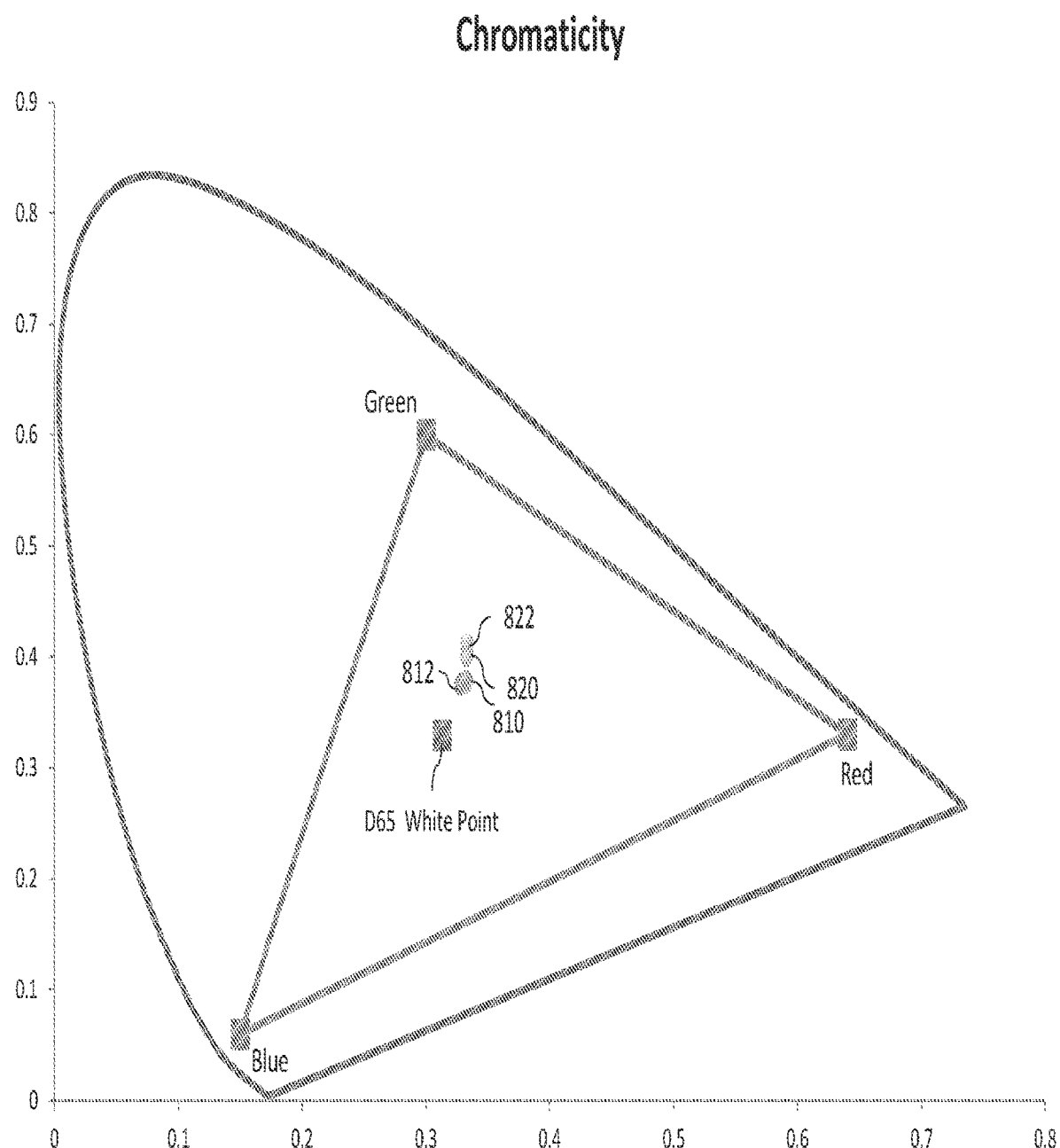
FIG. 8 is a chromaticity diagram associated with the P2 and P3 scribes of FIGS. 6 and 7.

It should be noted that these calculations utilize transmission data, which may be calculated from absorbance and/or reflection data, thus possibly introducing some negligible error due to reflection and scattering. The data is presented in Table 1, along with the calculated ΔE2000 values comparing the reference spectrum to the fit. As shown by the low ΔE2000 values (~1), the quality of the fits is excellent. Color and luminance data is represented in the standard XYZ tristimulous metrics (cd/m^2). All color metrics can be converted from these values. The Chromaticity coordinates (x, y, z) are derived from the XYZ luminance values. FIG. 8 provides a plot of the xyz Chromaticity values to facilitate a visual interpretation of the data as well. In FIG. 8, xyz coordinate (represented in the standard XYZ tristimulous metrics (cd/m^2)) for the P2 scribe target color matching spectrum 610 is shown at 810, the xyz coordinate for the best fit color matching curve 620 is shown at 812, the xyz coordinate for the P3 scribe target color matching spectrum 710 is shown at 820, the xyz coordinate for the best fit color matching curve 720 is shown at 822.

It should be noted that when filling a scribe with the scribe fill material, it may often be desirable to have the overall thickness similar to that of the scribe, to avoid over- or under-filling, which might have unfavorable impact on appearance and/or device performance. In order to assure a good match in O.D., as well as spectrum, between the scribe fill material and the surrounding material, it is necessary to adjust the concentration of the coloring elements in the scribe fill material ink to obtain the correct O.D. at the desired film thickness. In other words, once the ratio of coloring elements is determined based on the best fit coefficient values, the overall concentration of the coloring elements present in the scribe fill material ink may be adjusted as a function of the desired film thickness as deposited.

Figure 9:
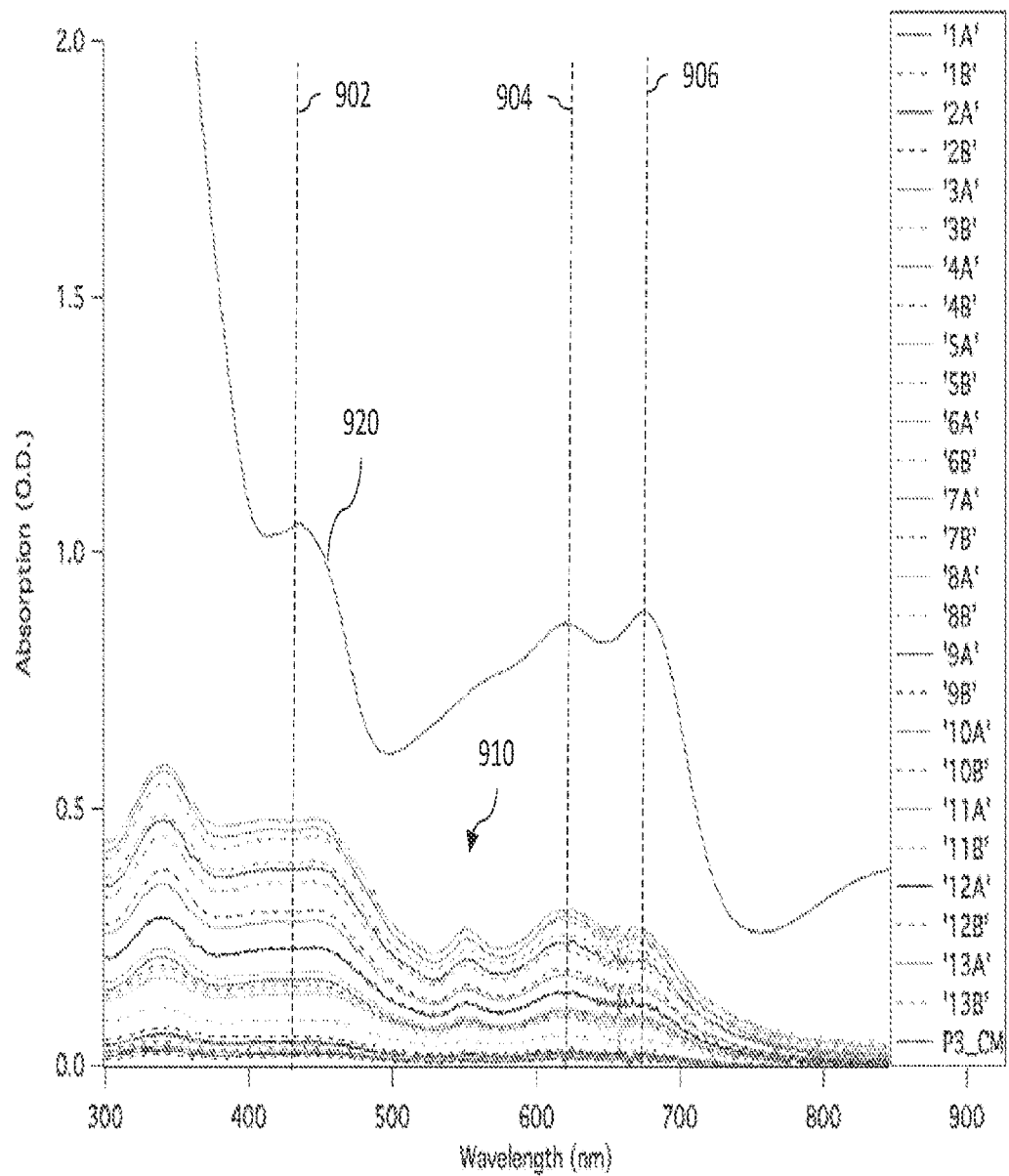
FIG. 9 is a graph illustrating Optical Density verses wavelength for scribe fill material ink deposited at a plurality of thicknesses and a target color matching spectrum scribe for one embodiment of the present disclosure.

Accordingly, the method proceeds to 440 with adjusting an overall concentration of the plurality of coloring elements present in the scribe fill material ink based on a target film thickness. In one embodiment, once an initial batch of scribe fill material ink has been prepared, films of varying thickness may be deposited (via blade coating, for example), and the intensity spectra/O.D. and film thicknesses measured for each film thickness. FIG. 9 is a graph illustrating O.D. verses wavelength for the scribe fill material ink deposited at a plurality of thicknesses (shown at 910), and a target color matching spectrum 920. For example purposes, the particular target color matching spectrum shown in FIG. 9 corresponds to the target color matching spectrum 710 for the P3 scribe shown in FIG. 7. The O.D. at wavelengths of interest, 435 nm (shown at 902), 620 nm (shown at 904), and 675 nm (shown at 906) in this example, and corresponding film thicknesses can then be used to determine an estimated thickness.

Figure 10:
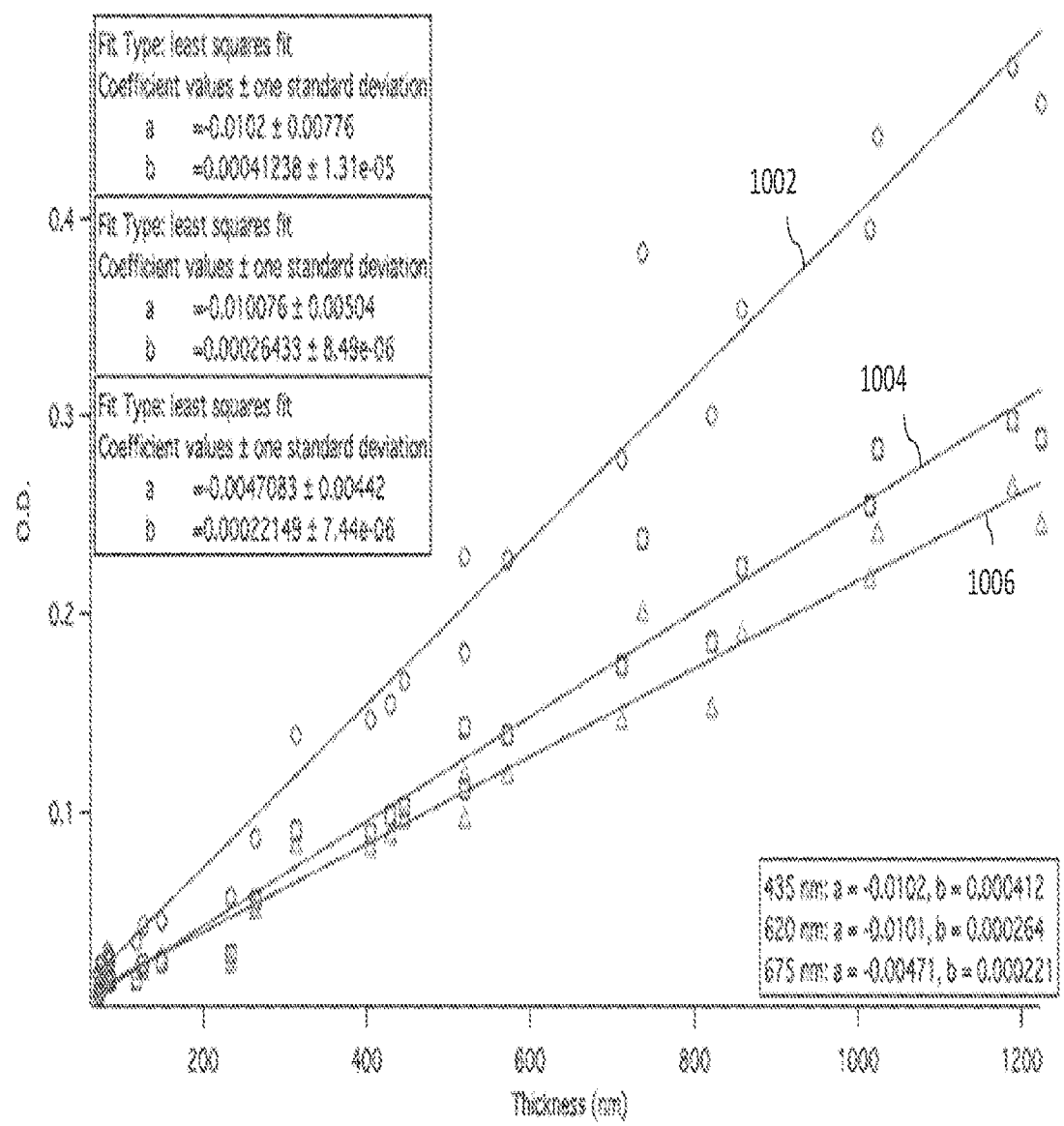
FIG. 10 is a graph illustrating Optical Density verses thickness.

FIG. 10 illustrates one example way in which estimated thickness may be determined. FIG. 10 plots O. D. vs. film thickness. As depicted in FIG. 10, a least squares linear regression fit (y=a+bx) can be calculated from the plots for each wavelength of interest (where, the best fit curve for 435 nm is shown at 1002, the best fit curve for 620 nm is shown at 1004, and the best fit curve for 675 nm is shown at 1006). It would be appreciated by those skilled in the art who have studied this disclosure that other wavelengths of interest may be selected depending on the particular application.

From the calculated fits and the desired O.D. from the target color matching spectrum 610, the thickness necessary to achieve the desired OD can be estimated as shown in Table 2, below.

TABLE 2

Calculated Scribe Fill Material Film Thickness Estimates and Ratios

|  | P3 CM OD | a | b | Est. Thickness (nm) | Ratio |
|---|---|---|---|---|---|
| 435 nm | 1.058 | −0.0102 | 0.000412 | 2593 | 3.46 |
| 620 nm | 0.8615 | −0.0101 | 0.000264 | 3302 | 4.40 |
| 675 nm | 0.88237 | −0.00471 | 0.000221 | 4014 | 5.35 |

For example, assuming a target thickness of the scribe fill material of 750 nm as deposited into the scribe, the ratio of the estimated thickness to target thickness provides an estimate of the adjustment in dye concentration that will be needed. For example, taking the average of the three ratios (3.46, 4.40 and 5.35) suggests an approximate 4.4 fold increase in coloring element concentration in the scribe fill material ink is required to produce the desired O.D. at the target thickness for the example P3 scribe described above in FIG. 7.

Example Embodiments

Example 1 includes a method for producing a thin-film electronic device, the method comprising: opening a scribe in a stack of thin film material layers deposited on a substrate to define an active region and an inactive region of the thin-film electronic device, wherein the stack of thin film material layers comprise at least one active semiconductor layer, wherein the active region comprises a non-scribed area of the stack of thin film material layers, wherein the inactive region comprises a region of the stack of thin film material layers where thin film material was removed by the scribe; depositing at least one scribe fill material into a gap opened by the scribe, wherein the scribe fill material has embedded therein one or more coloring elements, wherein the one or more coloring elements alter an optical characteristics spectrum of the inactive region to obtain an optical characteristics spectrum of the active region within a minimum perceptible difference for an industry defined standard observer.

Example 2 includes the method of example 1, further comprising: determining an intensity spectra for a plurality of coloring element input samples; determining an intensity spectra for a material layers removed from a thin film stack; determining ratios of the plurality of coloring element input samples to produce a scribe fill material ink, wherein the ratios provide a best fit estimate of the intensity spectra for the material layers removed from the thin film stack; and adjusting an overall concentration of the plurality of coloring elements present in the scribe fill material ink based on a target film thickness.

Example 3 includes the method of any of examples 1-2, wherein the optical characteristics spectrum of the inactive region obtains the optical characteristics spectrum of the active region within a $\Delta E2000 \leq 3$.

Example 4 includes the method of any of examples 1-3, wherein opening the scribe in the stack of thin film material layers comprises using a laser or a mechanical scribe to selectively remove material from the thin film material layers deposited on the substrate.

Example 5 includes the method of any of examples 1-4, wherein the scribe comprises at least one of a P1, a P2 or a P3 scribe.

Example 6 includes the method of any of examples 1-5, wherein the substrate is either transparent or opaque with respect to visible light.

Example 7 includes the method of any of examples 1-6, wherein depositing the at least one scribe fill material into the gap opened by the scribe comprises one of aerosol jet printing, ink jet printing, screen printing, gravure printing, and spectrographic micro contact printing Example 8 includes the method of any of examples 1-7, wherein depositing the at least one scribe fill material into the gap opened by the scribe comprises depositing an scribe fill material ink onto the inactive region, wherein the scribe fill material ink comprises: a solvent, the at least one scribe fill material, and the one or more coloring elements, wherein the one or more coloring elements and the at least one scribe fill material is soluble in the solvent.

Example 9 includes the method of example 8, wherein the one or more coloring elements are soluble in the solvent.

Example 10 includes the method of any of examples 8-9, further comprising: determining a baseline optical characteristics spectrum for the stack of thin film material layers in the active region; determining an optical characteristics spectrum for thin film material remaining in the inactive region prior to depositing the at least one scribe fill material into the gap opened by the scribe; determining a difference between the baseline optical characteristics spectrum and the optical characteristics spectrum for the thin film material remaining in the inactive region; and selecting the one or more coloring elements as a function of the difference.

Example 11 includes the method of example 10, wherein the one or more coloring elements are selected in ratios that drive an optical characteristics spectrum of the scribe fill material to obtain an optical characteristics spectrum of the material removed by opening the scribe.

Example 12 includes the method of any of examples 1-11, wherein, the one or more coloring elements comprises a sample of a same semiconductor material as comprised in the at least one active semiconductor layer.

Example 13 includes the method of any of examples 1-12, wherein the at least one scribe fill material comprises a ceramic.

Example 14 includes the method of any of examples 1-13, wherein depositing the at least one scribe fill material comprises fabricating at least a portion of an electrical monolithic interconnect.

Example 15 includes the method of any of examples 1-14, wherein depositing the at least one scribe fill material comprises fabricating at least a portion of an edge isolation seal.

Example 16 includes the method of any of examples 1-15, wherein active semiconductor layer comprises an organic photovoltaic semiconductor absorber layer Example 17 includes a thin film semiconductor device, the device comprising: a stack of thin film material layers deposited onto a substrate, the stack of thin film material layers subdivided into a plurality of semiconductor device cells divided by one or more scribes into an active region and an inactive region, wherein the stack of thin film material layers comprise at least one active semiconductor layer, wherein a first semiconductor device cell of the plurality of semiconductor device cells define an active region of the thin film semiconductor device, wherein the active region comprises a color characteristic defined by a first optical characteristics spectrum; and an inactive region formed on the substrate adjacent to the active region, the inactive region comprising at least one scribe fill material embedded with at least one coloring element, the inactive region having a color characteristic defined by a second optical characteristics spectrum; wherein the first optical characteristics spectrum and the second optical characteristics spectrum match within a minimum perceptible difference for an industry defined standard observer.

Example 18 includes the device of example 17, wherein active semiconductor layer comprises an organic photovoltaic semiconductor absorber layer.

Example 19 includes the device of any of examples 17-18, wherein the second optical characteristics spectrum of the inactive region obtains the first optical characteristics spectrum of the active region within a ≤5% deviation across the visual light spectrum and ≤2% deviation for at least one wavelength within the visual light spectrum.

Example 20 includes the device of any of examples 17-19, wherein the second optical characteristics spectrum of the inactive region obtains the first optical characteristics spectrum of the active region within a $\Delta E2000 \leq 3$.

Example 21 includes the device of any of examples 17-20, wherein the at least one coloring element and the at least one scribe fill material are both materials soluble in a first solvent.

Example 22 includes the device of any of examples 17-21, wherein the at least one scribe fill material comprises: a first scribe fill material embedded with a first coloring element and a second scribe fill material embedded with a second coloring element.

Example 23 includes the device of any of examples 17-22, wherein the at least one scribe fill material comprises an electrically insulating material and the at least one coloring element comprises either a pigment material or a dye material.

Example 24 includes the device of any of examples 17-23, wherein the at least one scribe fill material comprises an electrically conducting material and the at least one coloring element comprises either a pigment material or a dye material.

Example 25 includes the device of any of examples 17-24, wherein the at least one coloring element comprises a sample of a same semiconductor material as comprised in the at least one active semiconductor layer.

Example 26 includes the device of any of examples 17-25, wherein the substrate is opaque in the visual spectrum.

Example 27 includes the device of any of examples 17-26, wherein the at least one scribe fill material comprises a ceramic.

Example 28 includes the device of any of examples 17-27, wherein the inactive region comprises at least a portion of an electrical monolithic interconnect.

Example 29 includes the device of any of examples 17-28, wherein the inactive region comprises at least a portion of an edge isolation seal.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the presented embodiments. Therefore, it is manifestly intended that embodiments be limited only by the claims and the equivalents thereof.

What is claimed is:

1. A thin film semiconductor device, the device comprising:
    a stack of thin film material layers deposited onto a substrate, the stack of thin film material layers subdivided into a plurality of semiconductor device cells divided by one or more scribes into an active region and an inactive region, wherein the stack of thin film material layers comprise at least one active semiconductor layer, wherein a first semiconductor device cell of the plurality of semiconductor device cells defines an active region of the thin film semiconductor device, wherein the active region comprises a color characteristic defined by a first optical characteristics spectrum; and
    wherein the inactive region is formed on the substrate adjacent to the active region, the inactive region comprising at least one scribe fill material embedded with at least one coloring element, the inactive region having a color characteristic defined by a second optical characteristics spectrum;
    wherein the first optical characteristics spectrum and the second optical characteristics spectrum match within a minimum perceptible difference for an industry defined standard observer.

2. The device of claim 1, wherein the at least one active semiconductor layer comprises an organic photovoltaic semiconductor absorber layer.

3. The device of claim 1, wherein the second optical characteristics spectrum of the inactive region obtains the first optical characteristics spectrum of the active region within a <5% deviation across the visual light spectrum and <2% deviation for at least one wavelength within the visual light spectrum.

4. The device of claim 1, wherein the second optical characteristics spectrum of the inactive region obtains the first optical characteristics spectrum of the active region within a $\Delta E2000 < 3$.

5. The device of claim 1, wherein the at least one scribe fill material comprises either an electrically insulating material or an electrically conducting material; and
    the at least one coloring element comprises either a pigment material or a dye material.

6. The device of claim 1, wherein the at least one coloring element comprises a sample of a same semiconductor material as comprised in the at least one active semiconductor layer.

7. The device of claim 1, wherein the substrate is opaque in the visual spectrum.

8. The device of claim 1, wherein the at least one scribe fill material comprises a ceramic.

9. The device of claim 1, wherein the inactive region comprises one of:
    at least a portion of an electrical monolithic interconnect, or
    at least a portion of an edge isolation seal.

10. A method for producing a thin film semiconductor device, the method comprising:
    depositing a stack of thin film material layers onto a substrate, the stack of thin film material layers subdivided into a plurality of semiconductor device cells divided by one or more scribes into an active region and an inactive region, wherein the stack of thin film material layers comprise at least one active semiconductor layer, wherein a first semiconductor device cell of the plurality of semiconductor device cells defines an active region of the thin film semiconductor device, wherein the active region comprises a color characteristic defined by a first optical characteristics spectrum; and
    forming the inactive region on the substrate adjacent to the active region, the inactive region comprising at least one scribe fill material embedded with at least one coloring element, the inactive region having a color characteristic defined by a second optical characteristics spectrum, wherein the first optical characteristics spectrum and the second optical characteristics spectrum match within a minimum perceptible difference for an industry defined standard observer.

11. The method of claim 10, further comprising:
    applying a post deposition process after forming the inactive region, wherein the post deposition process causes changes to spectral qualities of the at least one scribe fill material to obtain the minimum perceptible difference.

12. The method of claim 10, wherein the at least one active semiconductor layer comprises an organic photovoltaic semiconductor absorber layer.

13. The method of claim 10, wherein the second optical characteristics spectrum of the inactive region obtains the first optical characteristics spectrum of the active region within a <5% deviation across the visual light spectrum and <2% deviation for at least one wavelength within the visual light spectrum.

14. The method of claim 10, wherein the second optical characteristics spectrum of the inactive region obtains the first optical characteristics spectrum of the active region within a $\Delta E2000 < 3$.

15. The method of claim 10, wherein the at least one scribe fill material comprises either an electrically insulating material or an electrically conducting material; and the at least one coloring element comprises either a pigment material or a dye material.

16. The method of claim 10, wherein the at least one coloring element comprises a sample of a same semiconductor material as comprised in the at least one active semiconductor layer.

17. The method of claim 10, wherein the substrate is opaque in the visual spectrum.

18. The method of claim 10, wherein the at least one scribe fill material comprises a ceramic.

19. The method of claim 10, wherein the inactive region comprises one of:
  at least a portion of an electrical monolithic interconnect, or
  at least a portion of an edge isolation seal.

20. The method of claim 10, wherein forming the inactive region includes depositing a scribe fill material ink.

* * * * *